(12) United States Patent
Nozaki et al.

(10) Patent No.: US 6,569,578 B2
(45) Date of Patent: May 27, 2003

(54) METHOD FOR FORMING PHOTO-MASK

(75) Inventors: Yuji Nozaki, Kanagawa (JP); Yasuki Kimura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/795,148

(22) Filed: Mar. 1, 2001

(65) Prior Publication Data
US 2001/0019802 A1 Sep. 6, 2001

(30) Foreign Application Priority Data
Mar. 3, 2000 (JP) ........................................ 2000-058822

(51) Int. Cl.⁷ ................................................. G03F 9/00
(52) U.S. Cl. ............................. 430/5; 430/30; 430/296; 430/942
(58) Field of Search .............................. 430/5, 30, 296, 430/942

(56) References Cited

U.S. PATENT DOCUMENTS 6,379,851 B1 * 4/2002 Innes .......................... 430/30

FOREIGN PATENT DOCUMENTS

| JP | 5-152200 | 6/1993 |
| JP | 10-221851 | 8/1998 |

* cited by examiner

*Primary Examiner*—Christopher G. Young
(74) *Attorney, Agent, or Firm*—Volentine Francos, PLLC

(57) ABSTRACT

A method for forming a photo-mask includes forming a light-shielding layer on a substrate, coating a resist film on the light-shielding layer, exposing the resist film with low dosage, and inclining a resist profile after developing the exposed resist film. Accordingly, an opening dimension of the light-shielding layer can be designed without depending on the location of the region with respect to the formed resist pattern of the photo-mask.

16 Claims, 4 Drawing Sheets

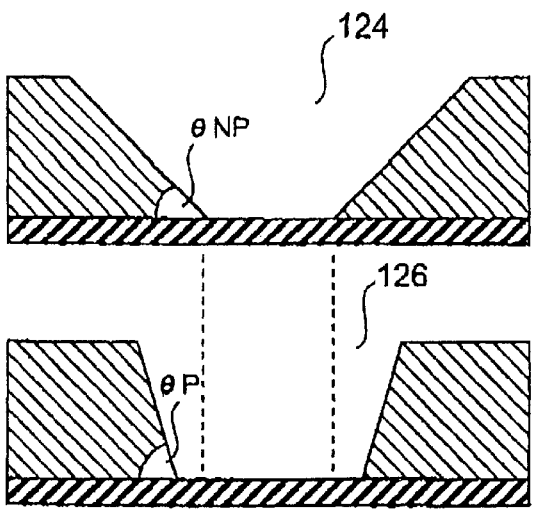
Fig. 4A
Fig. 4B
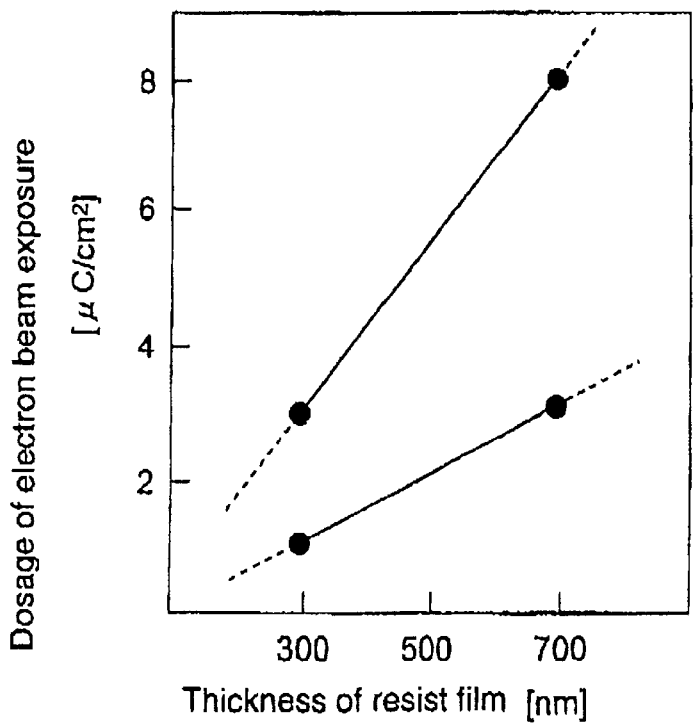
Fig. 5

METHOD FOR FORMING PHOTO-MASK

BACKGROUND OF THE INVENTION

1. Field of the Invention

The present invention generally relates to a method for forming a mask, and more particularly, the present invention relates to the method for forming the mask being utilized for lithography processes in semiconductor device fabrication.

This application is a counterpart of Japanese application Serial Number 58822/2000, filed Mar. 3, 2000, the subject matter of which is incorporated herein by reference.

2. Description of the Related Art

In general, as high integration advance, exposing technique has changed from exposing technique in a lump to electron beam exposing.

FIG. 1 is a plane-view showing a photo-mask according to a conventional art.

As shown in FIG. 1, a first region 200 shown with a slanting line in a photo-mask is not exposed. Since an area of exposure pattern 202 per unit area in a left side region of a broken line L–L' is less than a half exposure area in the photo-mask, the exposure pattern 202 is defined as a small region. Since an area of exposure pattern 204 per unit area in a right side region of a broken line L–L' exceeds a half of all exposure area, the exposure pattern 204 is defined as a large region.

FIG. 2A–FIG. 2E are cross-sectional views showing a method for forming a mask using an electron beam exposure taken on line K–K' of FIG. 1.

As shown in FIG. 2A, a light-shielding layer 102 such as chrome is formed on a quartz substrate 100. Then a positive-type resist film 104a having a thickness of 300–500 μm is formed on the light-shielding layer 102.

As shown in FIG. 2B, the resist film 104a is exposed using electron beam exposure. Here, dosage of the electron beam exposure is 6–10 [μC/cm2]. Then, the exposed resist film 104a is developed. As a result, a resist pattern 104b is formed.

As shown in FIG. 2C, for removing resist remained on the light-shielding layer 102, a slight etching process is carried out.

As shown in FIG. 2D, the light-shielding layer 102 is etched using the remained resist pattern 104d as a mask.

As shown in FIG. 2E, the remained resist pattern 104d is removed. Processes as described above form photo-mask.

In processes as described above, as shown in FIG. 2A, when small and large regions of the exposure pattern 204 are formed depending on location of region, an opening size difference causes such as sizes A and B shown in FIG. 2B.

The opening size difference causes by fogging effect. The fogging effect has disclosed that "Shimomura, N., Ogasawara, M., Takamatsu. J., Yoshitake, S., Ooki, K., Nakayamada, N., Okabe, F., and Tojo, T.: "Reduction of fogging effect caused by scattered electrons in an electron beam system", Part of the SPIE Symposium on Photomask and x-ray Mask Technology VI yokohama, Japan, September 1999, pp. 408–415".

Since an opening size difference such as sizes A and B exists, the resist pattern 104C if formed so that a size C of opening 107 is smaller than a size D of opening 108, as shown in FIG. 2C. Accordingly, as shown in FIG. 2E, an opening size F in the large region is formed larger than the designed size even if an opening size E in the small region is formed as designed.

It is desired to form opening size of the light-shielding layer 102 as designed without depending on the location of region formed resist pattern in the mask.

SUMMARY OF THE INVENTION

An object of the present invention is to provide a method for forming a photo-mask that can form an opening dimension of the light-shielding layer pattern as designed without depending on the location of region formed resist pattern in the photo-mask.

According to one aspect of the present invention, for achieving the above object, there is provided A method for forming a mask comprising: forming a light-shielding layer on a substrate; forming a resist film having small and large regions on the light-shielding layer, the small and the large regions being defined as the exposed area; exposing the resist film with low dosage using electron beam exposure according to a predetermined pattern data; and forming a resist pattern having a first opening in the small region and a second opening in the large region by developing the exposed resist pattern; wherein the elevation angle of the first opening sidewall in the small region is smaller than an elevation angle of the second opening sidewall in the large region.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in connection with the accompanying drawings, in which:

FIG. 4A and FIG. 4B are cross-sectional views showing each resist pattern openings in the small and large regions of the exposure area according to the first preferred embodiment of the invention.

FIG. 5 is a graph showing a relation between the thickness of the resist film and the dosage of the electron beam exposure.

DETAILED DESCRIPTION OF THE PREFERRED EMBODIMENTS

A method for forming a photo-mask according to a first preferred embodiment of a present invention will hereinafter be described in detail with reference to the accompanying FIG. 3A–FIG. 3E.

Figure 1:
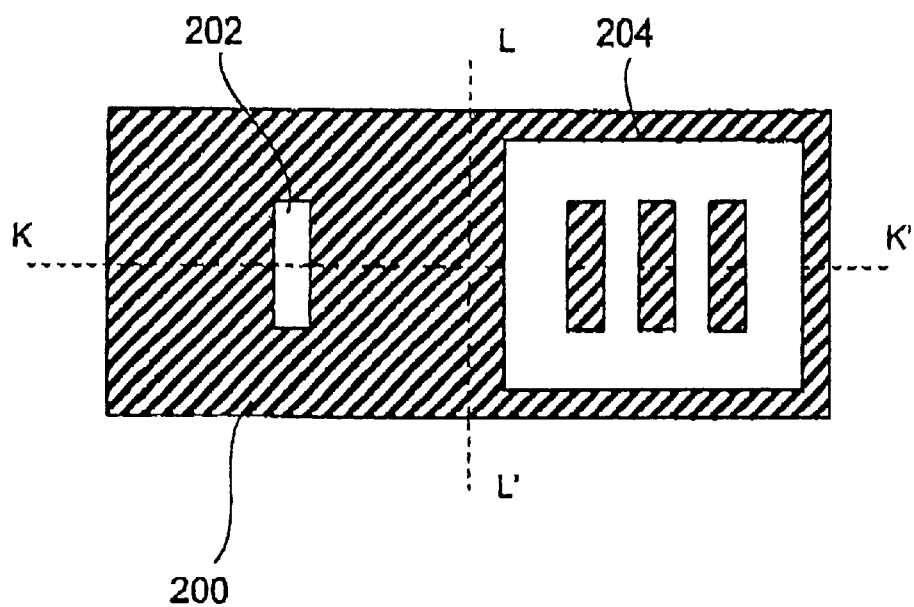
FIG. 1 is a plane-view showing a photo-mask according to a conventional art.
Figure 2A:
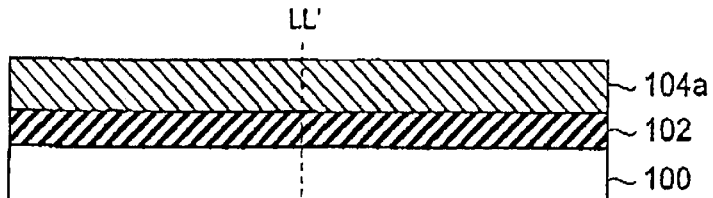
FIG. 2A–FIG. 2E are cross-sectional views showing a method for forming a mask using an electron beam exposure taken on line K–K' of FIG. 1.
Figure 2B:
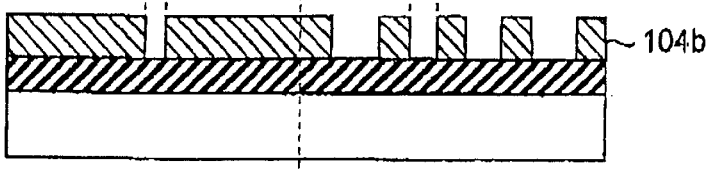
Figure 2C:
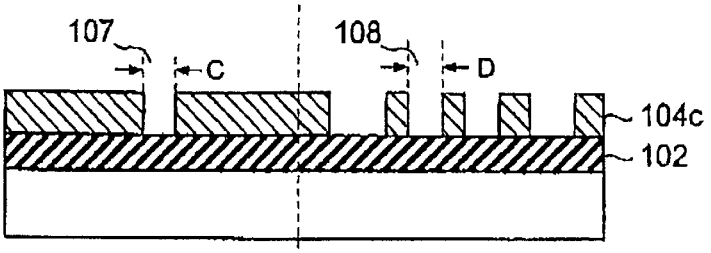
Figure 2D:
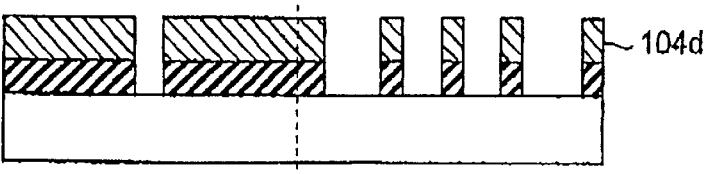
Figure 2E:
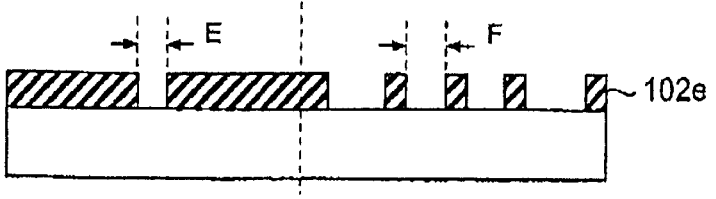

A plane-view of the photo-mask according to the first preferred embodiment of the present invention is the same as shown in FIG. 1.

As shown in FIG. 1, a first region 200 shown with a slanting line in the photo-mask is no exposed area. Since an area of an exposed pattern 202 per unit area in a left side region of a broken line L–L' is less than a half of the whole area in the photo-mask, the exposed pattern 202 is defined as a small region of the exposed area. Since an area of an exposed pattern 204 per unit area in a right side region of a broken line L–L' exceeds a half of the whole area, the exposure pattern 204 is defined as a large region of the exposed area.

The method for forming the photo-mask is as follows.

FIG. 3A–FIG. 3E are cross-sectional views showing the method for forming the photo-mask using electron beam exposure taken on line K–K' of FIG. 1. A broken line of FIG. 3A–FIG. 3E is the same as the broken line L–L' as shown in FIG. 1.

Figure 3A:
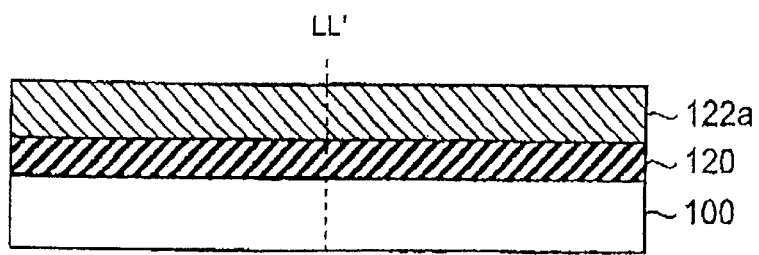
FIG. 3A–FIG. 3E are cross-sectional views showing the method for forming the photo-mask using an electron beam exposure taken on line K–K' of FIG. 1.

As shown in FIG. 3A, a light-shielding layer 120 such as chrome is formed on a quartz substrate 100. Then, a positive resist film 122a having a thickness of 300 nm is formed on the light-shielding layer 120.

Figure 3B:
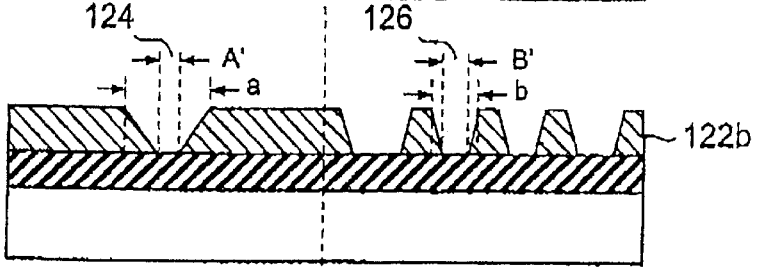

As shown in FIG. 3B, the positive resist film 122a is exposed using electron beam exposure according to a pre-determined pattern data. Here, dosage of the electron beam exposure is 1–3 [$\mu$C/cm2]. As the significant point, the dosage is lower than the conventional art. Further, the predetermined pattern data is as follows. In the designed size between small and large regions of the exposed area, the same pattern is defined as the same pattern. Then, the exposed resist film 122a is developed. As a result, a resist pattern 122b is formed. Here, the developing is carried out using spray type development of a solution including diethyl malonate and diethyl ketone. By the electron beam exposure, after the developing, each sidewall of openings 124, 126 in the resist pattern 122b has a tapered shape. Therefore, an upper portion size a of the opening 124 is larger than a bottom portion size A' of that. An upper portion size b of the opening 126 is larger than a bottom portion size B' of that. Here, the pattern data of the opening 124 is the same as that of the opening 126 for the exposure. Further, the exposure area in the small region of the exposed area is 5–10%, and the exposure area in the large region of the exposed area is 90%. As a result of experiment, a size difference (B'-A') between bottom portion sizes A' and B' is 30 nm.

FIG. 4A and FIG. 4B are cross-sectional views showing each resist pattern openings in the small and large regions of the exposure area according to the first preferred embodiment of the invention.

As shown in FIG. 4A and FIG. 4B, an elevation angle for the opening 124 is different from the opening 126. Here, the elevation angle defines as an angle between the substrate surface (or the light-shielding layer 120) and the sidewall of the opening. Therefore, the elevation angle $\theta$NP of the opening 124 sidewall in the small region is smaller than an elevation angle $\theta$P of the opening 126 sidewall in the large region. Because of the first preferred embodiment has a low dosage compared to the conventional art, each sidewall of openings 124, 126 in the resist pattern 122b has a tapered shape. That is, the openings 124, 126 have the elevation angle so as to wide from the bottom portion to the upper portion thereof.

Further, the large region of the exposed area has a dosage larger than the small region of that by a fogging effect. Accordingly, the elevation angle $\theta$NP for the sidewall of the opening 124 in the small region is smaller than the elevation angle $\theta$P for the sidewall of the opening 126 in the large region.

A size ratio between upper and bottom portions in the opening can be changed by dosage. An opening size of the bottom portion can be larger than an opening size of the upper portion with decreasing the dosage density. Accordingly, the opening size of the bottom portion can be controlled so as to be the predetermined design data.

Figure 3C:
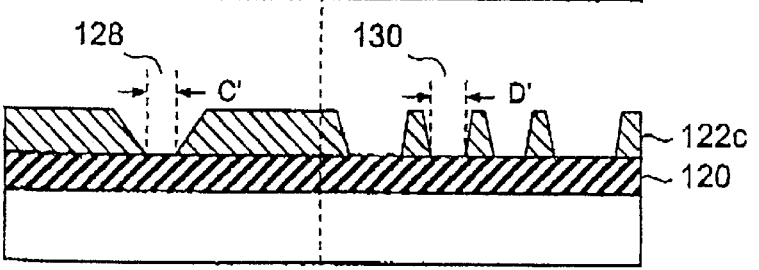

As shown in FIG. 3C, a slight etching process is carried out for the resist pattern 122b surface using oxygen-plasma etching. Here, the slight etching process is carried out so that the size C' of the bottom portion in the opening 128 is the same as the size D' in the bottom portion in the opening 130.

Figure 3D:
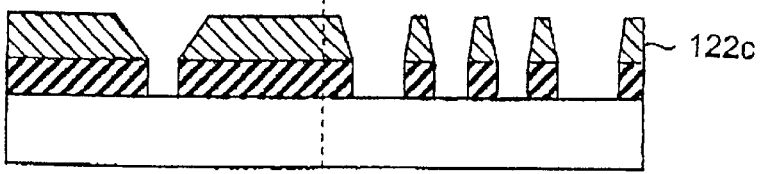

As shown in FIG. 3D, the light-shielding layer 120 is etched using the etched resist pattern 122c as a mask until the substrate 100 surface is exposed. Here, the etching process is carried out using spray type. An etchant is a solution including cerium ammonium nitrate and perchloric acid.

Figure 3E:
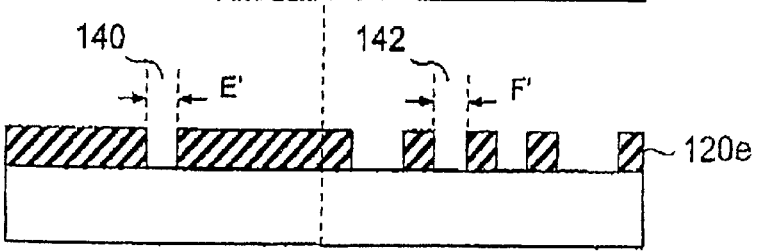

As shown in FIG. 3E, the resist pattern 122c is removed. As a result, the light-shielding pattern 120e is formed.

Processes as described above form the photo-mask.

Since the size C' of the opening 128 is the same as the size D' of the opening 130, the size E' of the opening 140 is the same as the size F' of the opening 142, as shown in FIG. 3C and FIG. 3E.

A size difference (B'-A') in opening bottom portions A', B' is 30 nm, after developing as shown in FIG. 3B. However, a size difference (F'-E') is less than 10 nm.

As mentioned above, in the light-shielding pattern fabrication of the photo-mask, the first preferred embodiment can solute problem that the resist pattern opening size is different between the small and large regions of the exposed area by fogging effect. According, the resist pattern opening size is the same between the small and large regions of the exposed area. Therefore, the first preferred embodiment can form an opening size of the light-shielding pattern as designed without depending on the exposed area in the photo-mask.

A method for forming a photo-mask according to a second preferred embodiment of a present invention will hereinafter be described in detail with reference to the accompanying FIG. 1 and FIG. 3A–FIG. 3E as with the first preferred embodiment.

In the second preferred embodiment, the positive resist film 122a having a thickness of 700 nm is formed on the light-shielding layer 120. Further, dosage of the electron beam exposure is 3–8 [$\mu$C/cm2].

As mentioned above, the second preferred embodiment can use in the close condition compared to the conventional dosage of the electron beam exposure. In the semiconductor fabrication, it is important to stable a treatment condition of the electron beam exposure. Further, the second preferred embodiment can be applied the light-shielding film having a thickness thicker than that of the first preferred embodiment.

A method for forming a photo-mask according to a third preferred embodiment is evolved from the first and second preferred embodiments.

The third preferred embodiment focused on the thickness of the positive resist film and the dosage of the electron beam exposure.

In the first preferred embodiment, the positive resist film having a thickness of 300 nm is formed on the light-shielding layer. The dosage of the electron beam exposure is 1–3 [$\mu$C/cm2].

In the second preferred embodiment, the positive resist film having a thickness of 700 nm is formed on the light-shielding layer. The dosage of the electron beam exposure is 3–8 [$\mu$C/cm2].

FIG. 5 is a graph showing a relation between the thickness of the resist film and the dosage of the electron beam exposure. In consideration of the thickness of the resist film between 300 nm and 700 nm, the selectable dosage is a range between first and second cross lines. Here, the first cross line is coordinate (300, 3) to coordinate (700, 8). The second cross line is coordinate (300, 1) to coordinate (700, 3).

$$Y=(1/80)X-0.75 \quad (1)$$

$$Y=(1/200)X-0.5 \quad (2)$$

Here, X [nm] is the thickness of the resist film. Y[μC/cm2] is the dosage of the electron beam exposure.

The selectable dosage is a range between formula 1 and formula 2.

$$(1/200)X-0.5 \geq Y \geq (1/80)X-0.75 \quad (3)$$

Formula 3 can satisfied in case that the thickness of the resist film is less than 300 nm or more than 700 nm. But, formula 3 can not satisfied in case that the thickness of the resist film is less than 50 nm.

As mentioned above, the third preferred embodiment could widely select the thickness of the resist film and the dosage of the electron beam exposure.

A method for forming a photo-mask according to a fourth preferred embodiment will hereinafter be described.

The fourth preferred embodiment could be applied to the first, second and third preferred embodiments.

After the developed process, by using AFM (Atomic Force Microscope), the elevation angles θNP and θNP are measured. Here, as defined before, the elevation angle defines as an angle between the substrate surface (or the light-shielding layer 120) and the sidewall of the opening. The elevation angle θNP is for the small region. The elevation angle θP is for the large region. After that, by using SEM (Scanning Electron Microscopy), a first bottom dimension of the resist pattern opening in the small region for the exposed area and a second bottom dimension of the resist pattern opening in the large region for the exposed area are measured. Difference in dimension ΔLf is found based on first and second dimensions.

After the slight etching process, to be satisfied the technical standard A, B (A, B>0) defining by the following formula 4, a well-chosen etched volume D [nm] is found by using the following formula 5 in the slight etching process.

$$-B<\Delta Lf<A \quad (4)$$

$$(\Delta Lf-A)/(2D)<(\sin \theta P-\sin \theta NP)/(\sin \theta P \times \sin \theta NP)<(\Delta Lf+B)/(2D) \quad (5)$$

The fourth preferred embodiment could achieve the predetermined etched volume D in the slight etching process.

The following will hereinafter be described how to find the formula 5.

As shown in FIG. 4A and FIG. 4B, the elevation angle θP for the sidewall of the opening 126 in the large region is larger than the elevation angle θNP for the sidewall of the opening 124 in the small region. The second bottom dimension of the resist pattern opening 126 in the large region for the exposed area is larger than the first bottom dimension of the resist pattern opening 124 in the small region for the exposed area. The second bottom dimension is ΔLf larger than the first bottom dimension.

$$D=RT \ (T>0)$$

Here, R indicates etch rate for resist. T indicates etch time. D indicates etched volume for the slight etching process.

The slight etching process is evenly carried out in perpendicular to the resist pattern surface. As shown in FIG. 4A, the first bottom dimension of the resist pattern opening 124 is $2RT(1/\sin \theta NP)$ larger than a dimension of the resist pattern before the etching process, because of the etching process is evenly carried out in perpendicular to a sidewall of the resist pattern. This is the reason why the etching volume of the resist pattern in horizontal direction is $RT(1/\sin \theta NP)$ when the etching process is carried out in perpendicular to an one-sided sidewall of the resist pattern. In consideration of both-sided side, the etching volume of the resist pattern in horizontal direction is $2RT(1/\sin \theta NP)$. As with the resist pattern opening 124, the second bottom dimension of the resist pattern opening 126 is $2RT(1/\sin \theta P)$. Therefore, $2RT(1/\sin \theta P)<2RT<2RT(1/\sin \theta NP)$. This is reason why each of θP and θNP is larger than 0°, and is smaller than 90°.

Here, θP>θNP.

Therefore, $\sin \theta P > \sin \theta NP (1/\sin \theta P) < (1/\sin \theta NP)$ After the developing process, the second dimension of the resist pattern opening 126 is ΔLf larger than the first dimension of the resist pattern opening 124.

After the slight etching process, $2RT(1/\sin \theta P)<2RT<2RT(1/\sin \theta NP)$. Therefore, the first dimension of the resist pattern opening 124 is larger than the second dimension of the resist pattern opening 126. As a result, the first dimension of the resist pattern opening 124 is equal to the second dimension of the resist pattern opening 126. Here, $T=T_0$ ($T_0$ is the slight etching time) Therefore, $$2RT_0(1/\sin \theta P)<2RT_0<2RT_0(1/\sin \theta NP)+\Delta Lf \quad (6)$$

Here, the second dimension of the resist pattern opening 126 as a reference value is defined as a dimension L. It is the most desirable that the first dimension of the resist pattern opening 124 is equal to the second dimension of the resist pattern opening 126 after the slight etching process and the slight etching time is $T_0$.

Further, in consideration of the actual fabrication process, in case of having the technical standard A, B (A, B>0) of the dimension L, the slight etching time will be described in case(1) and case(2). The technical standard is defined in the formula 4.

Case (1): $T<T_0$

After the slight etching process, It assumes that the second dimension of the resist pattern opening is larger than 126 the first dimension of the resist pattern opening 124.

$$(\text{second dimension})-(\text{first dimension})<A \quad (7)$$

The following formula 8 is found by using the formula 6 and the formula 7.

$$2RT(1/\sin \theta P)+\Delta Lf-2RT(1/\sin \theta NP)<A$$

$$2RT\{(1/\sin \theta P)-(1/\sin \theta NP)\}<A-\Delta Lf$$

$$\Delta Lf-A<2RT\{(1/\sin \theta NP)-(1/\sin \theta P)\}$$

$$(\Delta Lf-A)<(2RT)<(\sin \theta P-\sin \theta NP)/(\sin \theta P \times \sin \theta NP) \quad (8)$$

Case (2): $T>T_0$

After the slight etching process, It assumes that the first dimension of the resist pattern opening 124 is larger than the second dimension of the resist pattern opening 126.

$$(\text{first dimension})-(\text{second dimension})<A \quad (9)$$

The following formula 10 is found by using the formula 6 and the formula 9.

$$2RT\,(1/\sin\theta NP) - \{2RT\,(1/\sin\theta P) + \Delta Lf\} < B$$

$$2RT\{(1/\sin\theta NP) - (1/\sin\theta P)\} < \Delta Lf + B$$

$$2RT\{(\sin\theta P - \sin\theta NP)/(\sin\theta P \times \sin\theta NP)\} < \Delta Lf + B$$

$$(\sin\theta P - \sin\theta NP)/(\sin\theta P \times \sin\theta NP) < (\Delta Lf + B)/(2RT) \quad (10)$$

The formula 5 is found from the formula 9 and the formula 10 and D (=RT).

For example, $\theta NP=65°$, $\theta P=80°$, $\Delta Lf=20$[nm], $A=B=10$ [nm], The etching time will find by making substitution the example data to the formula 5.

$$D[\text{nm}]: 57 < D < 171$$

Here, etching rate of resist pattern R=50[nm/min]
Etching time T: 1.1<T<3.4

Therefore, it is selectable that etching time is from one minutes eight seconds to three minutes twenty four seconds.

By using the formula 5, the etching time is about two minutes sixteen seconds so that the first dimension of the resist pattern opening 124 is equal to the second dimension of the resist pattern opening 126 after the slight etching time.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall is within the true scope of the invention.

What is claimed is:

1. A method for forming a mask comprising:

forming a light-shielding layer on a substrate;

forming a resist film on the light-shielding layer;

exposing the resist film with low dosage using electron beam exposure according to a predetermined pattern data; and forming a resist pattern by developing the exposed resist film, the resist pattern having first and second regions with respective first and second exposed portions, the second exposed portions being greater than the first exposed portions, said forming a resist pattern comprising forming an elevation angle of an opening in the first exposed region smaller than an elevation angle of an opening in the second exposed region.

2. A method for forming a mask as claimed in claim 1, wherein the low dosage is 1–8 $\mu C/cm^2$.

3. A method for forming a mask as claimed in claim 1, wherein the substrate is made of a quartz.

4. A method for forming a mask as claimed in claim 1, wherein the developing process is carried out using spray type development of a solution including diethyl malonate and diethyl ketone.

5. A method for forming a mask as claimed in claim 1, further comprising:

performing a slight etching process on a resist pattern surface using oxygen-plasma etching, after said forming a resist pattern.

6. A method for forming a mask as claimed in claim 1, wherein an etched volume D is selected so as to satisfy:

$$(\Delta Lf - A)/(2D) < (\sin\theta P - \sin\theta NP)/(\sin\theta P \cdot \sin\theta NP) < (\Delta Lf + B)/(2D),$$

wherein after the developing process, $\theta$ NP is the elevation angle for a sidewall of the opening in the first region, $\theta$ P is the elevation angle for a sidewall of the opening in the second region, and $\Delta$ Lf is a difference between a bottom dimension of the opening in the first region and a bottom dimension of the opening in the second region, wherein after an etching of the resist film to provide the etched volume D, $$-B < \Delta Lf < A.$$

7. A method for forming a mask as claimed in claim 1, wherein the electron beam exposure is carried out to satisfy:

$$(1/200)X - 0.5 <= Y <= (1/80)X - 0.75,$$

where X is a thickness of the resist film in nm, and Y is a dosage of the electron beam in $\mu C/cm^2$.

8. A method for forming a mask comprising:

forming a light-shielding layer on a substrate;

forming a resist film on the light-shielding layer;

exposing the resist film with low dosage using electron beam exposure according to a predetermined pattern data; and forming a resist pattern having a first opening in a small region of exposure on the light-shielding layer and a second opening in a large region of exposure on the light-shielding layer, by developing the exposed resist pattern, wherein an elevation angle of a first opening sidewall in the small region is smaller than an elevation angle of a second opening sidewall in the large region.

9. A method for forming a mask as claimed in claim 8, wherein the low dosage is 1–8 $\mu C/cm^2$.

10. A method for forming a mask as claimed in claim 8, wherein the substrate is made of a quartz.

11. A method for forming a mask as claimed in claim 8, wherein the developing process is carried out using spray type development of a solution including diethyl malonate and diethyl ketone.

12. A method for forming a mask as claimed in claim 8, wherein the large region of exposure has a dosage larger than the small region of exposure.

13. A method for forming a mask as claimed in claim 8, further comprising:

performing a slight etching process on a resist pattern surface using oxygen-plasma etching, after said forming a resist pattern.

14. A method for forming a mask as claimed in claim 13, wherein the slight etching process is carried out so that a dimension of a bottom portion in the first opening is substantially equal to a dimension of a bottom portion in the second opening.

15. A method for forming a mask as claimed in claim 8, wherein an etched volume D is selected so as to satisfy:

$$(\Delta Lf-A)/(2D)<(\sin \theta P-\sin \theta NP)/(\sin \theta P\cdot\sin \theta NP)<(\Delta Lf+B)/(2D),$$

wherein after the developing process, θ NP is the elevation angle for a sidewall of the first opening, θ P is the elevation angle for a sidewall of the second opening, and Δ Lf is a difference between a bottom dimension of the first opening and a bottom dimension of the second opening, wherein after an etching of the resist film to provide the etched volume, $$-B<\Delta Lf<A.$$

16. A method for forming a mask as claimed in claim 8, wherein the electron beam exposure is carried out to satisfy:

$$(1/200)X-0.5<=Y<=(1/80)X-0.75,$$

where X is a thickness of the resist film in nm, and Y is a dosage of the electron beam in $\mu C/cm^2$.

\* \* \* \* \*